(12) United States Patent
Kim et al.

(10) Patent No.: US 11,852,752 B2
(45) Date of Patent: Dec. 26, 2023

(54) CROSS-TALK PREVENTION STRUCTURE OF ELECTRONIC DEVICE FOR MEASURING DISTANCE TO EXTERNAL OBJECT

(71) Applicant: Samsung Electronics Co., Ltd., Suwon-si (KR)

(72) Inventors: Ilyoung Kim, Suwon-si (KR); Hyunju Yang, Suwon-si (KR); Kihuk Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 448 days.

(21) Appl. No.: 16/834,284

(22) Filed: Mar. 30, 2020

(65) Prior Publication Data
US 2020/0319306 A1    Oct. 8, 2020

(30) Foreign Application Priority Data
Apr. 4, 2019    (KR) .................... 10-2019-0039668

(51) Int. Cl.
*G01S 7/481*    (2006.01)
*G01S 17/08*    (2006.01)
(Continued)

(52) U.S. Cl.
CPC .......... *G01S 7/4813* (2013.01); *G01S 17/08* (2013.01); *G01S 17/86* (2020.01); *H05K 9/0058* (2013.01)

(58) Field of Classification Search
None
See application file for complete search history.

(56) References Cited

U.S. PATENT DOCUMENTS

| | | | |
|---|---|---|---|
| 8,996,082 B2 * | 3/2015 | Tam ...................... | G01S 17/04 356/4.02 |
| 9,746,557 B2 | 8/2017 | Camarri et al. | |

(Continued)

FOREIGN PATENT DOCUMENTS

| | | |
|---|---|---|
| CN | 208386601 U | 1/2019 |
| KR | 101361844 B1 | 2/2014 |

(Continued)

OTHER PUBLICATIONS

International Search Report dated Jul. 21, 2020, issued in the International Application No. PCT/KR2020/004414.
(Continued)

*Primary Examiner* — Edemio Navas, Jr.
(74) *Attorney, Agent, or Firm* — Jefferson IP Law, LLP

(57) ABSTRACT

An electronic device for reducing noise occurring in measuring a distance to an external object is provided. The electronic device includes a cover glass, a rear cover facing the cover glass, a display disposed between the cover glass and the rear cover and having a hole formed in a specified area, a shielding layer disposed between the display and the rear cover and having the hole formed in an area corresponding to the specified area, a sensor module disposed in the hole to measure a distance between the electronic device and an external object, a printed circuit board (PCB) disposed between the shielding layer and the rear cover, and at least one processor disposed on the printed circuit board and operatively connected to the sensor module, wherein the sensor module may include a light emitting part that emits light based on a signal received from the processor, and a receiving part to receive the emitted light after being reflected from the external object and returning back, and a diaphragm structure disposed between the light emitting part and the receiving part and including a first region blocking first reflected light reflected from the shielding layer among (Continued)

the emitted light and a second region blocking second reflected light reflected from the cover glass among the emitted light.

13 Claims, 12 Drawing Sheets

(51) Int. Cl.
*G01S 17/86* (2020.01)
*H05K 9/00* (2006.01)

(56) References Cited

U.S. PATENT DOCUMENTS

| | | | |
|---|---|---|---|
| 9,976,894 B2 | 5/2018 | Yu et al. | |
| 10,190,908 B2 | 1/2019 | Yu et al. | |
| 10,477,082 B2 | 11/2019 | Jung et al. | |
| 2012/0129580 A1 | 8/2012 | Park et al. | |
| 2016/0025855 A1 | 1/2016 | Camarri et al. | |
| 2016/0301852 A1* | 10/2016 | Krishnamurthy Sagar | G01B 11/14 |
| 2016/0370580 A1* | 12/2016 | Takada | G02B 5/005 |
| 2017/0141241 A1 | 5/2017 | Yu et al. | |
| 2018/0266877 A1 | 9/2018 | Yu et al. | |
| 2019/0058814 A1 | 2/2019 | Jung et al. | |
| 2019/0097066 A1 | 3/2019 | Yu et al. | |

FOREIGN PATENT DOCUMENTS

| | | | | |
|---|---|---|---|---|
| KR | 20180136386 A | * | 12/2018 | G06F 3/0421 |
| KR | 10-2019-0020533 A | | 3/2019 | |
| WO | 2015/025593 A1 | | 2/2015 | |

OTHER PUBLICATIONS

Extended European Search Report dated May 19, 2022, issued in European Patent Application No. 20784905.0.

* cited by examiner

CROSS-TALK PREVENTION STRUCTURE OF ELECTRONIC DEVICE FOR MEASURING DISTANCE TO EXTERNAL OBJECT

CROSS-REFERENCE TO RELATED APPLICATION(S)

This application is based on and claims priority under 35 U.S.C. § 119 of a Korean patent application number 10-2019-0039668, filed on Apr. 4, 2019, in the Korean Intellectual Property Office, the disclosure of which is incorporated by reference herein its entirety.

BACKGROUND

1. Field

The disclosure relates to technique for reducing noise occurring in the process of measuring a distance to an external object.

2. Description of Related Art

With the development of a technology capable of recognizing objects, the spread of an electronic device (e.g., smart phones) equipped with a time-of-flight (ToF) sensor has recently been widely performed. The electronic device may measure a distance between an external object and the electronic device through the ToF sensor, and execute various functions using the measured data. For example, the electronic device may generate virtual reality or augmented reality content using the measured data or recognize a user's face in a 3-dimensional (3D) shape.

The above information is presented as background information only to assist with an understanding of the disclosure. No determination has been made, and no assertion is made, as to whether any of the above might be applicable as prior art with regard to the disclosure.

SUMMARY

The time-of-flight (ToF) sensor may include a light emitting part that emits light and a receiving part that receives light reflected from an external object. The ToF sensor may measure the distance between the electronic device and the external object based on a time difference between emission of light from the light emitting part and its return to the receiving part after being reflected from the external object. However, part of the light output from the light emitting part may be input to the receiving part after being reflected by a component (e.g., cover glass or shielding layer) other than the external object. The light reflected from the other component (e.g., cover glass or shielding layer) may cause noise in the process of measuring the distance by the ToF sensor, and may deteriorate the sensitivity of the ToF sensor. In particular, when the size of a hole in which the ToF sensor is disposed is small, the amount of light reflected from the other component (e.g., cover glass or shielding layer) increases, and thus noise may further increase.

Embodiments disclosed herein are intended to provide an electronic device capable of reducing noise.

Aspects of the disclosure are to address at least the above-mentioned problems and/or disadvantages and to provide at least the advantages described below. Accordingly, an aspect of the disclosure is to provide an electronic device capable of reducing noise.

Additional aspects will be set forth in part in the description which follows and, in part, will be apparent from the description, or may be learned by practice of the presented embodiments.

In accordance with an aspect of the disclosure, an electronic device is provided. The electronic device includes a cover glass, a rear cover facing a cover glass, a display disposed between the cover glass and the rear cover and having a hole formed in a specified area, a shielding layer disposed between the display and the rear cover and having the hole formed in an area corresponding to the specified area, a sensor module disposed in the hole to measure a distance between the electronic device and an external object, a printed circuit board (PCB) disposed between the shielding layer and the rear cover, and at least one processor disposed on the printed circuit board and operatively connected to the sensor module, wherein the sensor module may include a light emitting part that emits light based on a signal received from the processor, and a receiving part to receive the emitted light after being reflected from the external object and returning back, and a diaphragm structure disposed between the light emitting part and the receiving part and including a first region blocking first reflected light reflected from the shielding layer among the emitted light, and a second region blocking second reflected light reflected from the cover glass among the emitted light.

In accordance with another aspect of the disclosure, a sensor module is provided. The sensor module includes a substrate, a light emitting part disposed on the substrate to emit light, a receiving part disposed on the substrate to receive the emitted light after being reflected from an external object and returning back, a cover contacting the substrate and surrounding the light emitting part and the receiving part and a diaphragm structure disposed between the light emitting part and the receiving part, wherein the diaphragm structure may include a first region formed on the cover and having a first length, and a second region formed on the first region and having a second length shorter than the first length.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
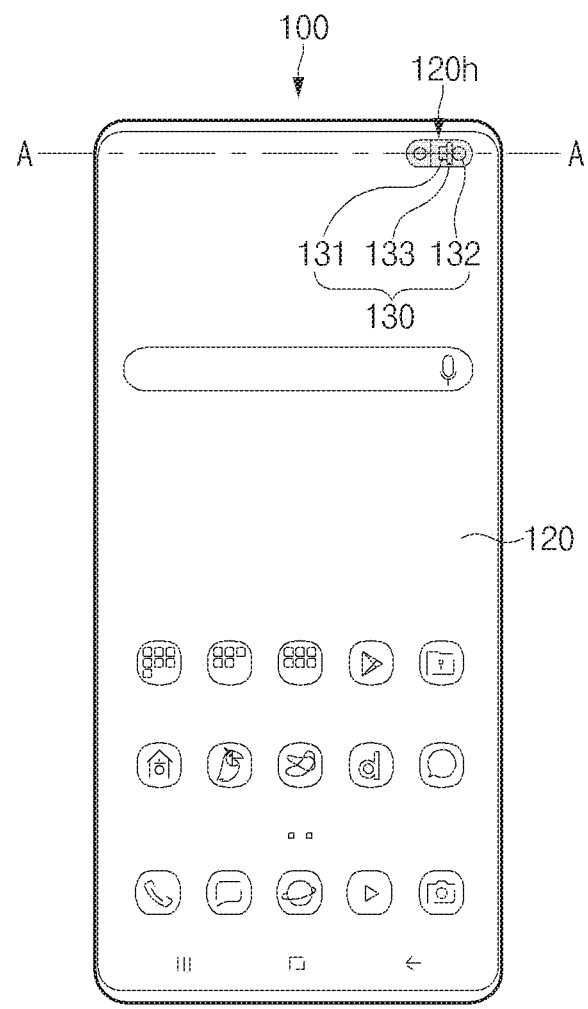
FIG. 1 illustrates one surface of an electronic device according to an embodiment of the disclosure.

FIG. 1 illustrates one surface of an electronic device according to an embodiment of the disclosure.

Referring to FIG. 1, an electronic device 100 may include a display 120 and a sensor module 130.

The display 120 may be disposed inside the electronic device 100 and may be exposed through one surface (or front surface) of the electronic device 100. According to an embodiment, when viewed from the outside of the electronic device 100, a size of the display 120 may occupy most of the one surface of the electronic device 100. In the disclosure, the display 120 may be referred to as a full-front display or a bezel-less display.

According to an embodiment, a hole 120h may be formed in a portion of the display 120, and the sensor module 130 may be disposed in the hole 120h. The sensor module 130 may include a light emitting part 131 that emits light and a receiving part 132 that receives light reflected from an external object (e.g., a user's face). The sensor module 130 may measure a distance between the electronic device 100 and the external object (e.g., a user's face) based on a time difference between the emission of light from the light emitting part 131 and its return to the receiving part 132 after being reflected from the external object.

In the case of an electronic device according to a comparative example, the light output from the light emitting part may be directly input to the receiving part or reflected from some components in the electronic device to be input to the receiving part. The light that is directly input from the light emitting part or input to the receiving part after being reflected from some of the components may cause noise in the process of measuring the distance in the sensor module. That is, part of light input to the receiving part may not be light reflected from the external object, which may cause noise in the process of measuring the distance in the sensor module.

However, the electronic device 100 according to an embodiment of the disclosure may include a diaphragm structure 133 between the light emitting part 131 and the receiving part 132. The diaphragm structure 133 may block the light reflected from some of the components, and therefore, most of the light input to the receiving part 132 may be light reflected from the external object and return back. Accordingly, the noise caused in the process of measuring the distance in the sensor module 130 may be reduced, and detection performance of the sensor module 130 may be improved.

Figure 2:
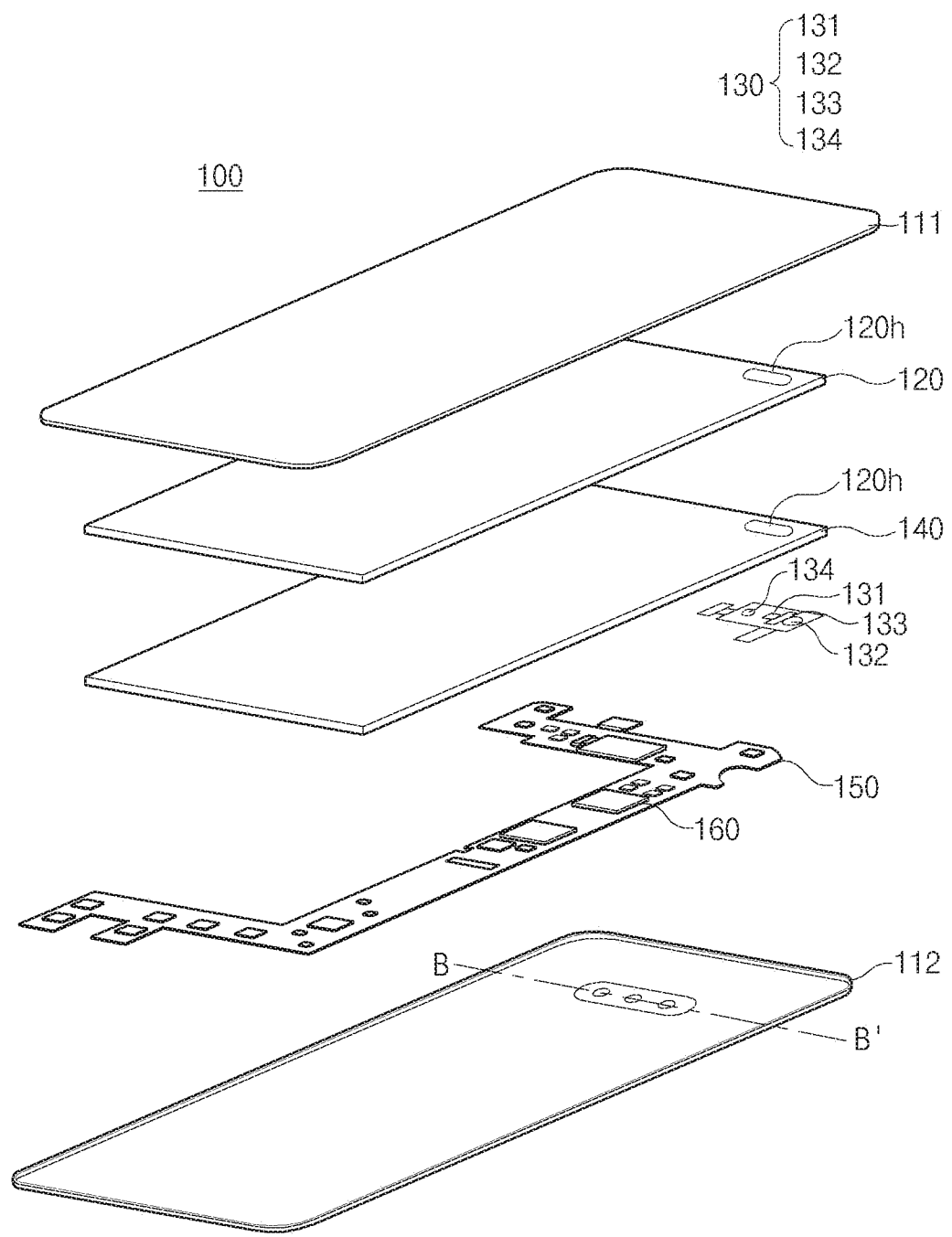
FIG. 2 illustrates an exploded perspective view of an electronic device according to an embodiment of the disclosure.

FIG. 2 illustrates an exploded perspective view of an electronic device according to an embodiment of the disclosure.

Referring to FIG. 2, the electronic device 100 may include a cover glass 111, a rear cover 112, the display 120, the sensor module 130, a shielding layer 140, a printed circuit board 150, and a processor 160.

The cover glass 111 may transmit light generated by the display 120. In addition, a user may touch an upper surface of the cover glass 111 using a part of a body (e.g., a finger) to perform a touch (including a touch using an electronic pen). The cover glass 111 may be formed of, for example, tempered glass, tempered plastic, flexible polymer material, or the like. According to an embodiment, the cover glass 111 may also be referred to as a glass window.

The rear cover 112 may be coupled to a back surface of the electronic device 100. The rear cover 112 may be formed of, for example, plastic, and/or metal. According to an embodiment, the rear cover 112 may be implemented integrally with the cover glass 111 or may be attached to the cover glass 111 to be detachable by a user.

The display 120 may output a variety of content (e.g., text, images, videos, icons, widgets, or symbols). In addition, the display 120 may receive a touch input (e.g., touch, gesture, or hovering) from the user.

The shielding layer 140 may be disposed between the display 120 and the printed circuit board 150. The shielding layer 140 may shield electromagnetic waves occurring between the display 120 and the printed circuit board 150 to prevent electromagnetic interference between the display 120 and the printed circuit board 150. According to an embodiment, the hole 120h may be formed in a specified area of the shielding layer 140.

The sensor module 130 may be exposed to the outside of the electronic device 100 through the display 120 and the hole 120h formed in the shielding layer 140. The sensor module 130 may include the light emitting part 131 that emits light and the receiving part 132 that receives light reflected from an external object. The sensor module 130 may measure a distance between the electronic device 100 and the external object based on a time difference of light from the light emitting part 131 and its return to the receiving part 132 after being reflected from the external object (e.g., the user's face). According to one embodiment, the sensor module 130 may further include a camera 134. The camera 134 may obtain image data by photographing an external object.

The printed circuit board 150 may mount various electronic parts, elements, printed circuits and the like of the electronic device 100. For example, the printed circuit board 150 may mount an application processor (AP), a communication processor (CP), a memory, and the like. In the disclosure, the printed circuit board 150 may be referred to as a main board, a printed circuit board (PCB), or a printed board assembly (PBA).

The processor 160 may be operatively connected to the sensor module 130. The processor 160 may allow the light emitting part 131 to emit light in response to a user input. The light output from the light emitting part 131 may be reflected and return back from the external object, and the processor 160 may receive light which returns back to the receiving part 132 after being reflected from the external object. The processor 160 may measure the distance between the electronic device 100 and the external object based on the time difference between the emission of light from the light emitting part 131 and its return to the receiving part 132 after being reflected from the external object. According to an embodiment, the processor 160 may allow the camera 134 to photograph an external object in response to a user input, and may obtain image data corresponding to the external object.

In the case of an electronic device in a comparative example, light output from the light emitting part may be reflected from other components (e.g., the shielding layer and the cover glass) other than the external object and input to the receiving part. The light reflected from the other components (e.g., the shielding layer and the cover glass) and input to the receiving part may cause noise in the process of measuring the distance in the sensor module, and accordingly, the sensitivity of the sensor module may be reduced. However, the electronic device 100 according to an embodiment of the disclosure may include the diaphragm structure 133 between the light emitting part 131 and the receiving part 132. The diaphragm structure 133 may block light reflected from the other components (e.g., the shielding layer 140 and the cover glass 111), and therefore, most of the light input to the receiving part 132 may be light reflected from the external object and returned back. Accordingly, the noise caused in the process of measuring the distance in the sensor module 130 may be reduced, and detection performance of the sensor module 130 may be improved.

The embodiment shown in FIG. 2 is the various embodiments disclosed in the disclosure are not limited to those shown in FIG. 2. For example, the electronic device 100 may further include components not shown in FIG. 2, and the stacked structure of the electronic device 100 may be different from that of FIG. 2. In addition, in the disclosure, the components having the same reference numerals as the components of the electronic device 100 shown in FIG. 2 may have the contents as described in FIG. 2.

Figure 3:
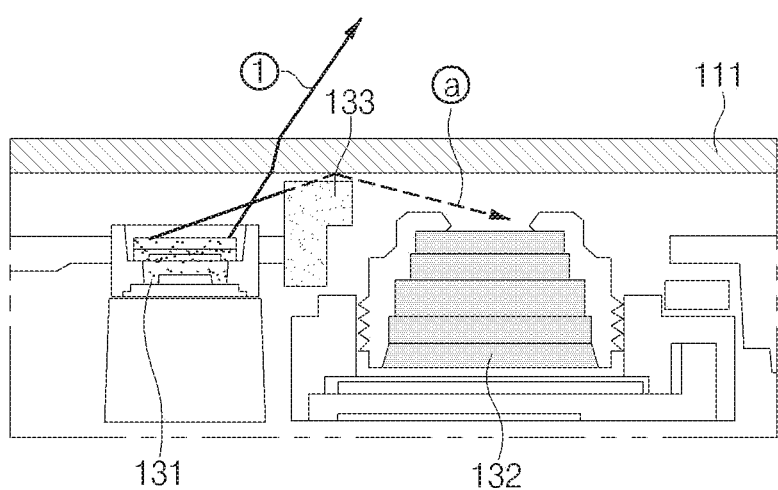
FIG. 3 illustrates a cross-sectional view of an electronic device according to an embodiment of the disclosure.

FIG. 3 illustrates a cross-sectional view of an electronic device according to an embodiment of the disclosure. FIG. 3 is a cross-sectional view taken along line A-A' of the electronic device shown in FIG. 1. FIG. 3 is a diagram for describing in detail how reflected light is blocked by a diaphragm structure.

Referring to FIG. 3, the light emitting part 131 may emit light in response to a signal received from the processor 160. The light output from the light emitting part 131 may be emitted in various directions. For example, the light output from the light emitting part 131 may be emitted not only in the direction (①) of the cover glass 111 but also in the direction in which the receiving part 132 is located.

The receiving part 132 may receive light reflected from the external object and returning back among the light output from the light emitting part 131. When light is input to the receiving part 132, the processor 160 may measure the distance between the electronic device 100 and the external object based on the time difference between the emission of light from the light emitting part 131 and its return to the receiving part 132 after being reflected from the external object. That is, part of the light output from the light emitting part 131 may be emitted out of the electronic device 100 through a first path, and may return back to the receiving part 132 after being reflected by the external object. The processor 160 may measure the distance between the electronic device 100 and the external object based on light input to the receiving part 132 through the first path.

The diaphragm structure 133 may be disposed between the light emitting part 131 and the receiving part 132 to block part of the light output from the light emitting part 131. For example, when there is no diaphragm structure 133, first reflected light which is reflected from the shielding layer 140 among the light output from the light emitting part 131 may be input to the receiving part 132 through multiple reflection. However, the diaphragm structure 133 according to the embodiment disclosed herein may prevent the first reflected light from being input to the receiving part 132 by blocking the first reflected light. In another embodiment, when there is no diaphragm structure 133, second reflected light which is reflected from the cover glass 111 among the light output from the light emitting part 131 may be input to the receiving part 132 through an "a" path ⓐ. However, the diaphragm structure 133 according to the embodiment disclosed herein may prevent the second reflected light from being input to the receiving part 132 by blocking the second reflected light.

In the electronic device according to the comparative example, first reflected light reflected from the shielding layer and second reflected light reflected from the cover glass cannot be prevented from being input to the receiving part, causing the first reflected light and the second reflected light to act as noise. However, in the electronic device 100 according to the embodiment of the disclosure, the diaphragm structure 133 may block the first reflected light and the second reflected light, thus improving the sensitivity of the sensor module 130.

Figure 4A:
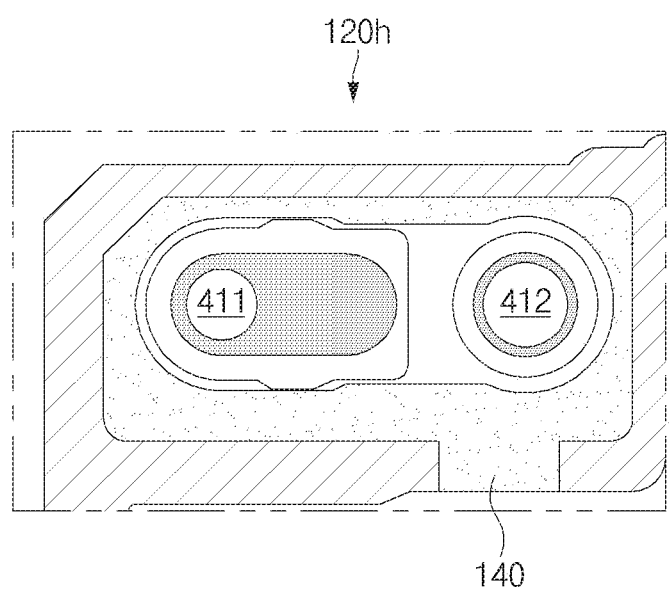
FIG. 4A illustrates a hole formed in a display and a shielding layer according to an embodiment of the disclosure.
Figure 4B:
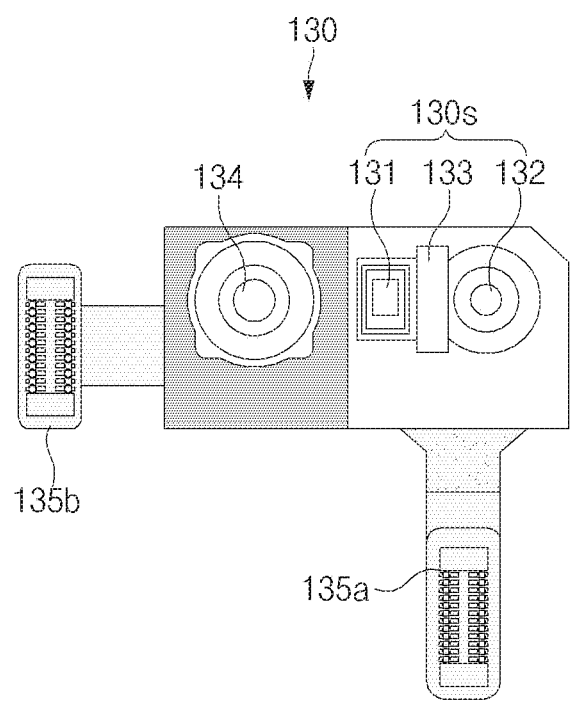
FIG. 4B illustrates a sensor module according to an embodiment of the disclosure.

FIG. 4A illustrates a hole formed in a display and a shielding layer according to an embodiment of the disclosure. FIG. 4A is an enlarged view of an area corresponding to the hole 120h in a state where the display 120 and the shielding layer 140 are assembled. FIG. 4B illustrates a sensor module according to an embodiment.

Referring to FIGS. 4A and 4B, a first hole 411 and a second hole 412 may be located in the hole 120h. A part of the receiving part 132 and a part of the camera 134 may be exposed to the outside of the electronic device 100 through the first hole 411 and the second hole 412, and a part of the light emitting part 131 and a part of the diaphragm structure 133 may be exposed to the outside of the electronic device 100 through a remaining area.

The sensor module 130 may include a distance measuring sensor 130s, the camera 134, a first flexible circuit board 135a, and a second flexible circuit board 135b. The distance measuring sensor 130s may be disposed in a portion of the sensor module 130, and may include the light emitting part 131, the receiving part 132, and the diaphragm structure 133. The distance measuring sensor 130s may measure the distance between the electronic device 100 and the external object based on a time difference between the emission of light from the light emitting part 131 and its return to the receiving part 132 after being reflected from the external object. The diaphragm structure 133 may be disposed between the light emitting part 131 and the receiving part 132 to block part of the light output from the light emitting part 131. In the disclosure, the distance measuring sensor 130s may be referred to as a Time-of-Flight (ToF) sensor 130.

The camera 134 may be disposed in another portion of the sensor module 130 other than the portion in which the distance measuring sensor 130s is disposed. The camera 134 may obtain image data by photographing the external object.

The first flexible printed circuit board 135a and the second flexible printed circuit board 135b may be connected to the printed circuit board 150 shown in FIG. 2 to operatively connect the processor 160 and the sensor module 130. The processor 160 may control the distance measuring sensor 130s and the camera 134 through the first flexible printed circuit board 135a and the second flexible printed circuit board 135b.

Figure 5:
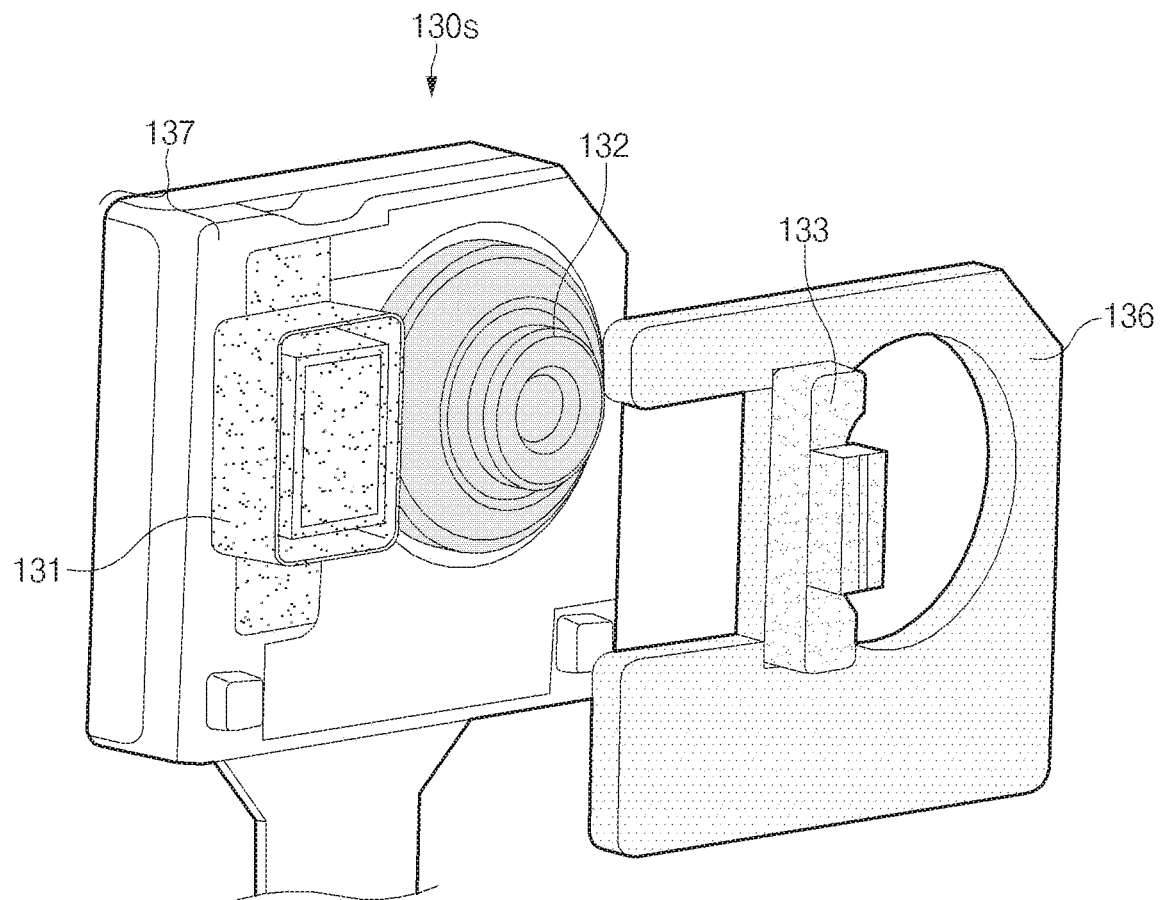
FIG. 5 is an enlarged view of a distance measuring sensor according to an embodiment of the disclosure.
Figure 6:
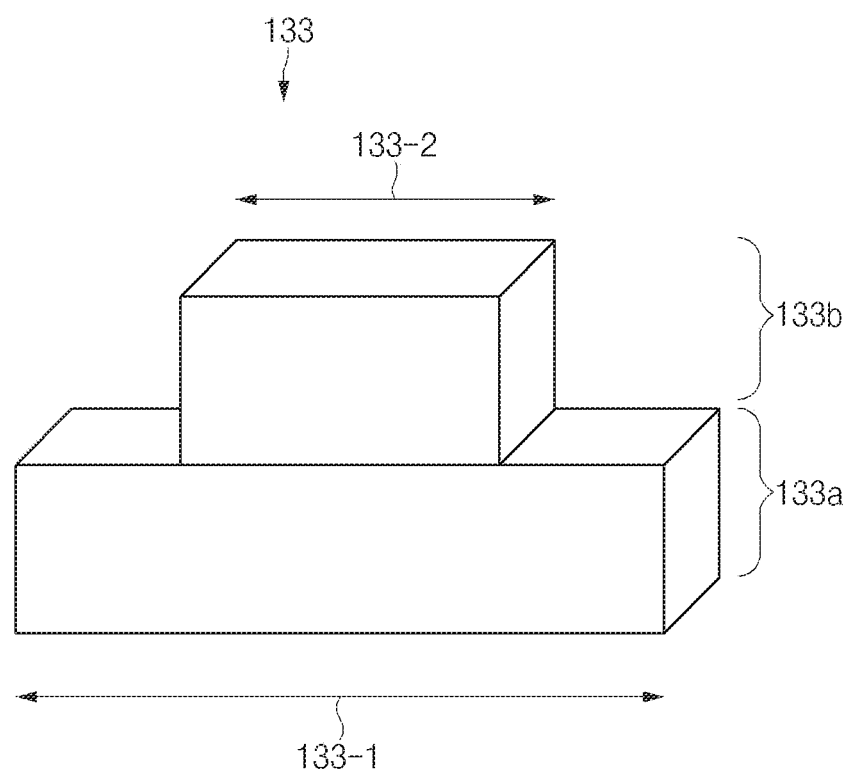
FIG. 6 is an enlarged view of a diaphragm structure according to an embodiment of the disclosure.

FIG. 5 is an enlarged view of a distance measuring sensor according to an embodiment of the disclosure. FIG. 6 is an enlarged view of a diaphragm structure according to an embodiment of the disclosure. FIGS. 5 and 6 are diagrams for describing the distance measuring sensor 130s and the diaphragm structure 133 disclosed in the disclosure.

Referring to FIG. 5, the distance measuring sensor 130s may include the light emitting part 131, the receiving part 132, the diaphragm structure 133, a cover 136, and a substrate (plate) 137. The substrate 137 may be a non-conductive material (e.g., plastic) capable of mounting the light emitting part 131, the receiving part 132, and the cover 136. For example, the light emitting part 131 and the receiving part 132 may be arranged side by side on one surface of the substrate 137, the cover 136 may surround the light emitting part 131 and the receiving part 132 on the one surface of the substrate 137.

According to an embodiment, the distance measuring sensor 130s may further include an integrated circuit (IC) (not shown) operatively connected to the light emitting part 131 and the receiving part 132. The integrated circuit may control the light emitting part 131 and the receiving part 132, and the distance between the electronic device 100 and the external object may be measured based on the time difference between the emission of light from the light emitting part 131 and its return to the receiving part 132 after being reflected from the external object.

Referring to FIG. 6, the diaphragm structure 133 may include a first region 133a formed on the cover 136 and having a first length 133-1 and a second region 133b formed on the first region 133a and having a second length 133-2 shorter than the first length 133-1. When the diaphragm structure 133 is formed on the cover 136 and the cover 136 is disposed on the substrate 137, the diaphragm structure 133 may block part of the light output from the light emitting part 131. For example, the first region 133a may block the first reflected light reflected from the shielding layer 140, and the second region 133b may block the second reflected light reflected from the cover glass 111.

Figure 7A:
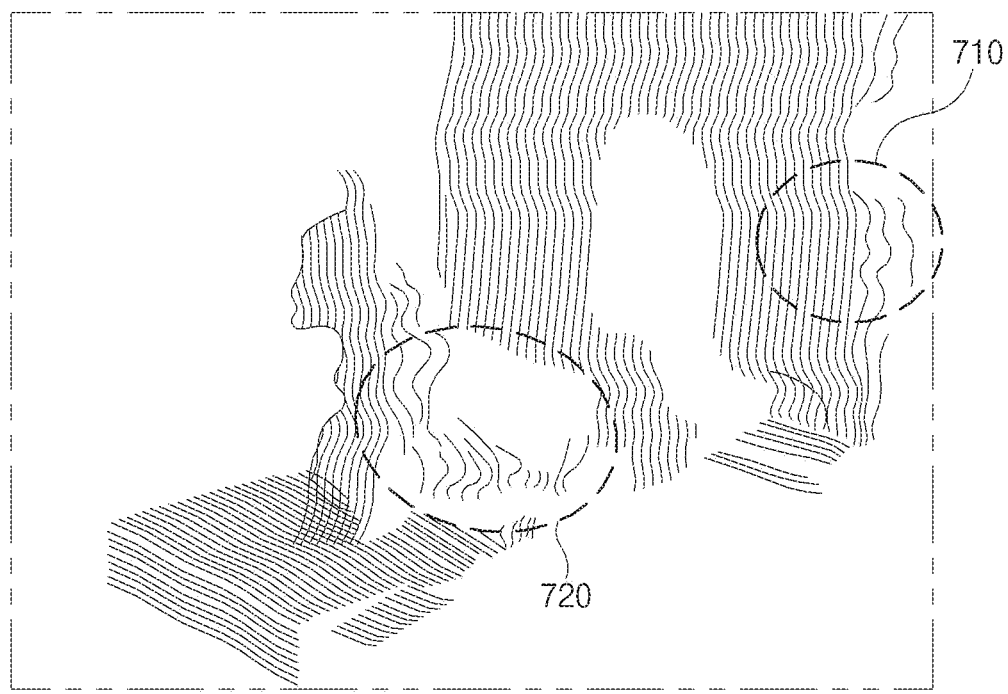
FIG. 7A shows a result of measurement of a distance from an external object in an electronic device according to a comparative example according to an embodiment of the disclosure.
Figure 7B:
FIG. 7B shows a result of measurement of a distance from an external object in an electronic device according to an embodiment of the disclosure.

FIG. 7A shows a result of measurement of a distance from an external object in an electronic device according to a comparative example according to an embodiment of the disclosure. FIG. 7B shows a result of measurement of a distance from an external object in an electronic device according to an embodiment the disclosure.

Referring to FIG. 7A, the electronic device according to the comparative example does not include a diaphragm structure, and therefore, part of the light output from the light emitting part may be reflected from the shielding layer and the cover glass and input to the receiving part. Accordingly, when the electronic device according to the comparative example measures a distance from an external object, noises 710 and 720 may be caused as shown in FIG. 7A.

Referring to FIG. 7B, however, the electronic device 100 according to the embodiment disclosed herein may include the concave-convex diaphragm structure 133 to block light which is reflected by the shielding layer 140 and the cover glass 111 and input to the receiving part 132. Accordingly, when the electronic device 100 according to the embodiment disclosed herein measures a distance from an external object, noise may not be caused as shown in FIG. 7B.

Figure 8:
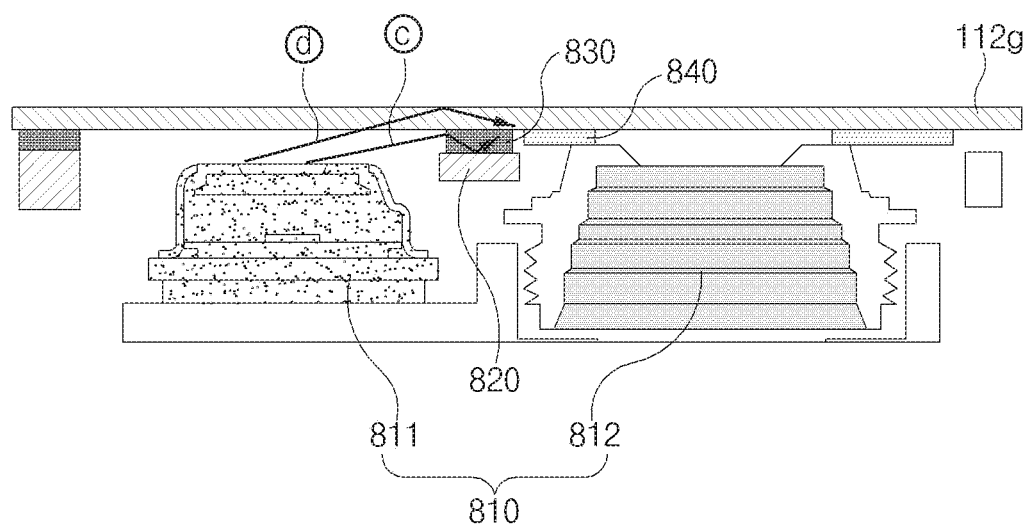
FIG. 8 is a cross-sectional view of an electronic device according to an embodiment of the disclosure.

FIG. 8 is a cross-sectional view of an electronic device according to an embodiment the disclosure. FIG. 8 is a cross-sectional view taken along line B-B' shown in FIG. 2.

Referring to FIG. 8, the electronic device 100 may include a rear sensor module 810, a rear glass 112g, a rear diaphragm structure 820, a waterproof tape 830, and a poron 840 (e.g., PORON®).

The rear sensor module 810 may include a rear light emitting part 811 that emits light and a rear receiving part 812 that receives light that returns back after light output from the rear light emitting part 811 is reflected from an external object. The rear sensor module 810 may measure a distance between the electronic device 100 and the external object based on a time difference between the emission of light from the rear light emitting part 811 and its return to the rear receiving part 812.

The rear glass 112g may be disposed on the rear cover 112 to protect the rear sensor module 810 from external shock. The rear glass 112g may be formed of, for example, tempered glass, reinforced plastic, or a flexible polymer material.

The rear diaphragm structure 820 may be disposed between the rear light emitting part 811 and the rear receiving part 812 to support the rear glass 112g. In addition, the rear diaphragm structure 820 may block part of the light output from the rear light emitting part 811 such that light is not directly input from the rear light emitting part 811 to the rear receiving part 812.

The waterproof tape 830 may attach the cover glass 111 to the diaphragm structure 133. According to an embodiment, the waterproof tape 830 may refract part of the light output from the rear light emitting part 811 to reduce noise input to the rear receiving part 812. For example, part of the light output from the rear light emitting part 811 may be emitted to the outside of the electronic device 100 by being refracted through a "c" path ⓒ. Accordingly, noise input to the rear receiving part 812 may be reduced, and sensitivity of the rear sensor module 810 may be improved.

The poron 840 may be attached to a specified area of the cover glass 111. The poron 840 may block light reflected from the rear glass 112g among the light output from the rear light emitting part 811 to reduce noise input to the rear receiving part 812. For example, part of the light output from the rear light emitting part 811 may be blocked by the poron 840 after being reflected by the rear glass 112g along a "d" path ⓓ. The light reflected by the rear glass 112g may be blocked, thus reducing noise input to the rear receiving part 812 and improving sensitivity of the rear sensor module 81.

Figure 9:
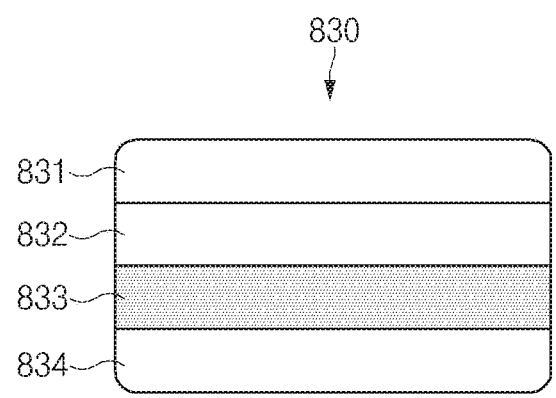
FIG. 9 illustrates a cross-sectional view of a waterproof tape according to an embodiment of the disclosure.

FIG. 9 illustrates a cross-sectional view of a waterproof tape according to an embodiment of the disclosure.

Referring to FIG. 9, the waterproof tape 830 may include a plurality of layers. For example, the waterproof tape 830 may include a first layer 831, a second layer 832, a third layer 833, and a fourth layer 834.

The first layer 831 may be a layer made of an adhesive material and may be attached to the rear glass 112g. According to one embodiment, the first layer 831 may be transparent, and the thickness of the first layer 831 may be about 88 μm.

The second layer 832 may absorb shock applied through the rear glass 112g as a buffer layer. According to one embodiment, the thickness of the second layer 832 may be about 78 μm.

The third layer 833 may be a black layer and may block light input from the second layer 832 or the fourth layer 834. According to an embodiment, the thickness of the third layer 833 may be about 46 μm.

The fourth layer 834 may be a layer made of an adhesive material and may be attached to the rear diaphragm structure 820. According to an embodiment, the thickness of the fourth layer 834 may be about 88 μm.

The stacked structure of the waterproof tape 830 illustrated in FIG. 9 the various embodiments of the disclosure are not limited to those illustrated in FIG. 9.

According to an embodiment disclosed herein, an electronic device may include a cover glass, a rear cover facing the cover glass, a display disposed between the cover glass and the rear cover and having a hole formed in a specified area, a shielding layer disposed between the display and the rear cover and having the hole formed in an area corresponding to the specified area, a sensor module disposed in the hole to measure a distance between the electronic device and an external object, a printed circuit board disposed between the shielding layer and the rear cover, and a processor disposed on the printed circuit board and operatively connected to the sensor module, wherein the sensor module may include a light emitting part that emits light based on a signal received from the processor, and a receiving part configured to receive the emitted light after being reflected from the external object and returning back, and a diaphragm structure disposed between the light emitting part and the receiving part and including a first region blocking first reflected light reflected from the shielding layer among the emitted light and a second region blocking second reflected light reflected from the cover glass among the emitted light.

According to an embodiment disclosed herein, the first region and the second region may have a stepped structure when the diaphragm structure is viewed from the light emitting part and the receiving part.

According to an embodiment disclosed herein, the first region may have a first length extending in a first direction, and the second region may have a second length extending in the first direction and shorter than the first length.

According to an embodiment disclosed herein, the sensor module may further include a substrate that mounts the light emitting part and the receiving part.

According to an embodiment disclosed herein, the sensor module may further include a cover disposed on the substrate to surround the light emitting part and the receiving part.

According to an embodiment disclosed herein, the first region may be formed on the cover and the second region is formed on the first region.

According to an embodiment disclosed herein, the sensor module may further include a camera that photographs the external object.

According to an embodiment disclosed herein, the processor may obtain image data corresponding to the external object in response to a user input received through the display.

According to an embodiment disclosed herein, the sensor module may further include a flexible printed circuit board connecting the light emitting part and the receiving part to the processor.

According to an embodiment disclosed herein, the processor may measure a distance between the electronic device and the external object based on a time difference between emission of light from the light emitting part and its return to the receiving part.

According to an embodiment disclosed herein, the electronic device may further include a rear glass disposed on a first region of the rear cover, and a rear sensor module exposed through the rear glass.

According to an embodiment disclosed herein, the rear sensor module may include a rear light emitting part that emits light and a rear receiving part that receives light which is reflected from the external object and returns back after emitted from the rear light emitting part.

According to an embodiment disclosed herein, the electronic device may further include a rear diaphragm structure disposed between the rear light emitting part and the rear receiving part, a waterproof tape attaching the rear glass to the rear diaphragm structure, and a poron formed on a surface of the rear glass facing the rear sensor module.

According to an embodiment disclosed herein, the waterproof tape may reflect part of the light emitted from the rear light emitting part to be emitted toward outside of the rear glass.

According to an embodiment disclosed herein, the poron may block light reflected from the rear glass among the light emitted from the rear light emitting part.

According to an embodiment disclosed herein, a sensor module may include a substrate, a light emitting part disposed on the substrate to emit light, a receiving part disposed on the substrate to receive the emitted light after being reflected from an external object and returning back, a cover contacting the substrate and surrounding the light emitting part and the receiving part, and a diaphragm structure disposed between the light emitting part and the receiving part, wherein the diaphragm structure may include a first region formed on the cover and having a first length, and a second region formed on the first region and having a second length shorter than the first length.

According to an embodiment disclosed herein, the sensor module may further include a flexible printed circuit board connected to an external processor.

According to an embodiment disclosed herein, the sensor module may further include a camera disposed on the substrate to photograph the external object.

According to an embodiment disclosed herein, the sensor module may further include an integrated circuit operatively connected to the receiving part to measure a distance between the sensor module and the external object based on light returning back after being reflected by the external object.

According to an embodiment disclosed herein, the first region and the second region have a stepped structure when viewed from the light emitting part and the receiving part.

Figure 10:
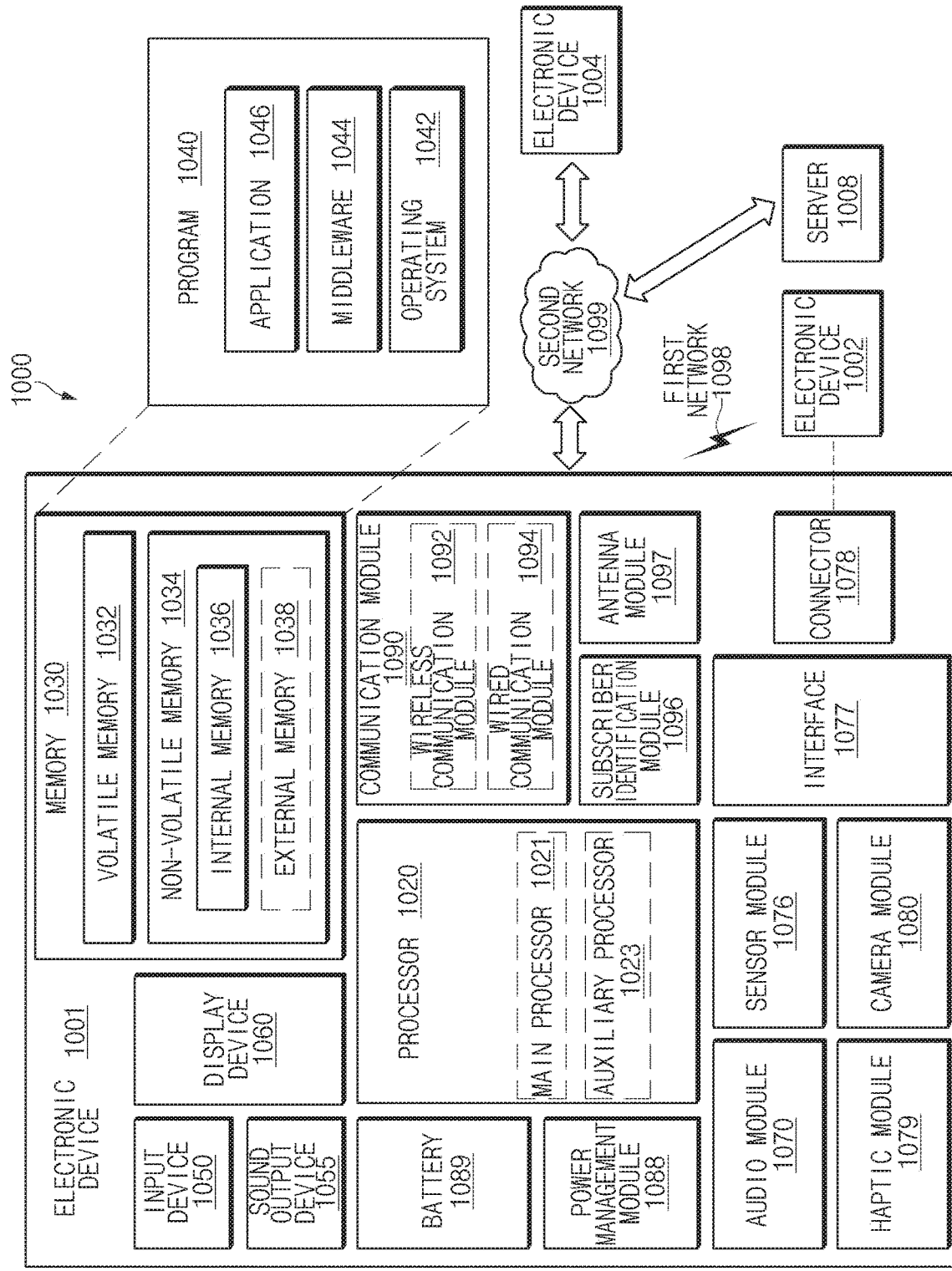
FIG. 10 is a block diagram of an electronic device in a network environment, according to an embodiment of the disclosure.

FIG. 10 is a block diagram illustrating an electronic device 1001 in a network environment 1000 according to an embodiment of the disclosure.

Referring to FIG. 10, the electronic device 1001 in the network environment 1000 may communicate with an electronic device 1002 via a first network 1098 (e.g., a short-range wireless communication network), or an electronic device 1004 or a server 1008 via a second network 1099 (e.g., a long-range wireless communication network). According to an embodiment, the electronic device 1001 may communicate with the electronic device 1004 via the server 1008. According to an embodiment, the electronic device 1001 may include a processor 1020, memory 1030, an input device 1050, a sound output device 1055, a display device 1060, an audio module 1070, a sensor module 1076, an interface 1077, a haptic module 1079, a camera module 1080, a power management module 1088, a battery 1089, a communication module 1090 (e.g., a transceiver), a subscriber identification module (SIM) 1096, or an antenna module 1097 (e.g., an antenna). In some embodiments, at least one (e.g., the display device 1060 or the camera module 1080) of the components may be omitted from the electronic device 1001, or one or more other components may be added in the electronic device 1001. In some embodiments, some of the components may be implemented as single integrated circuitry. For example, the sensor module 1076 (e.g., a fingerprint sensor, an iris sensor, or an illuminance sensor) may be implemented as embedded in the display device 1060 (e.g., a display).

The processor 1020 may execute, for example, software (e.g., a program 1040) to control at least one other component (e.g., a hardware or software component) of the electronic device 1001 coupled with the processor 1020, and may perform various data processing or computation. According to one embodiment, as at least part of the data processing or computation, the processor 1020 may load a command or data received from another component (e.g., the sensor module 1076 or the communication module 1090) in volatile memory 1032, process the command or the data stored in the volatile memory 1032, and store resulting data in non-volatile memory 1034. According to an embodiment, the processor 1020 may include a main processor 1021 (e.g., a central processing unit (CPU) or an application processor (AP)), and an auxiliary processor 1023 (e.g., a graphics processing unit (GPU), an image signal processor (ISP), a sensor hub processor, or a communication processor (CP)) that is operable independently from, or in conjunction with, the main processor 1021. Additionally or alternatively, the auxiliary processor 1023 may be adapted to consume less power than the main processor 1021, or to be specific to a specified function. The auxiliary processor 1023 may be implemented as separate from, or as part of the main processor 1021.

The auxiliary processor 1023 may control at least some of functions or states related to at least one component (e.g., the display device 1060, the sensor module 1076, or the communication module 1090) among the components of the electronic device 1001, instead of the main processor 1021 while the main processor 1021 is in an inactive (e.g., sleep) state, or together with the main processor 1021 while the main processor 1021 is in an active state (e.g., executing an application). According to an embodiment, the auxiliary processor 1023 (e.g., an image signal processor or a communication processor) may be implemented as part of another component (e.g., the camera module 1080 or the communication module 1090) functionally related to the auxiliary processor 1023.

The memory 1030 may store various data used by at least one component (e.g., the processor 1020 or the sensor module 1076) of the electronic device 1001. The various data may include, for example, software (e.g., the program 1040) and input data or output data for a command related thereto. The memory 1030 may include the volatile memory 1032 or the non-volatile memory 1034.

The program 1040 may be stored in the memory 1030 as software, and may include, for example, an operating system (OS) 1042, middleware 1044, or an application 1046.

The input device 1050 may receive a command or data to be used by another component (e.g., the processor 1020) of the electronic device 1001, from the outside (e.g., a user) of the electronic device 1001. The input device 1050 may include, for example, a microphone, a mouse, a keyboard, or a digital pen (e.g., a stylus pen).

The sound output device 1055 may output sound signals to the outside of the electronic device 1001. The sound output device 1055 may include, for example, a speaker or a receiver. The speaker may be used for general purposes, such as playing multimedia or playing record, and the receiver may be used for incoming calls. According to an embodiment, the receiver may be implemented as separate from, or as part of the speaker.

The display device 1060 may visually provide information to the outside (e.g., a user) of the electronic device 1001. The display device 1060 may include, for example, a display, a hologram device, or a projector and control circuitry to control a corresponding one of the display, the hologram device, and the projector. According to an embodiment, the display device 1060 may include touch circuitry adapted to detect a touch, or sensor circuitry (e.g., a pressure sensor) adapted to measure the intensity of force incurred by the touch.

The audio module 1070 may convert a sound into an electrical signal and vice versa. According to an embodiment, the audio module 1070 may obtain the sound via the input device 1050, or output the sound via the sound output device 1055 or a headphone of an external electronic device (e.g., an electronic device 1002) directly (e.g., wiredly) or wirelessly coupled with the electronic device 1001.

The sensor module 1076 may detect an operational state (e.g., power or temperature) of the electronic device 1001 or an environmental state (e.g., a state of a user) external to the electronic device 1001, and then generate an electrical signal or data value corresponding to the detected state. According to an embodiment, the sensor module 1076 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1077 may support one or more specified protocols to be used for the electronic device 1001 to be coupled with the external electronic device (e.g., the electronic device 1002) directly (e.g., wiredly) or wirelessly. According to an embodiment, the interface 1077 may include, for example, a high definition multimedia interface (HDMI), a universal serial bus (USB) interface, a secure digital (SD) card interface, or an audio interface.

A connecting terminal 1078 may include a connector via which the electronic device 1001 may be physically connected with the external electronic device (e.g., the electronic device 1002). According to an embodiment, the connecting terminal 1078 may include, for example, a HDMI connector, a USB connector, a SD card connector, or an audio connector (e.g., a headphone connector).

The haptic module 1079 may convert an electrical signal into a mechanical stimulus (e.g., a vibration or a movement) or electrical stimulus which may be recognized by a user via his tactile sensation or kinesthetic sensation. According to an embodiment, the haptic module 1079 may include, for example, a motor, a piezoelectric element, or an electric stimulator.

The camera module 1080 may capture a still image or moving images. According to an embodiment, the camera module 1080 may include one or more lenses, image sensors, image signal processors, or flashes.

The power management module 1088 may manage power supplied to the electronic device 1001. According to one embodiment, the power management module 1088 may be implemented as at least part of, for example, a power management integrated circuit (PMIC).

The battery 1089 may supply power to at least one component of the electronic device 1001. According to an embodiment, the battery 1089 may include, for example, a primary cell which is not rechargeable, a secondary cell which is rechargeable, or a fuel cell.

The communication module 1090 may support establishing a direct (e.g., wired) communication channel or a wireless communication channel between the electronic device 1001 and the external electronic device (e.g., the electronic device 1002, the electronic device 1004, or the server 1008) and performing communication via the established communication channel The communication module 1090 may include one or more communication processors that are operable independently from the processor 1020 (e.g., the application processor (AP)) and supports a direct (e.g., wired) communication or a wireless communication. According to an embodiment, the communication module 1090 may include a wireless communication module 1092 (e.g., a cellular communication module, a short-range wireless communication module, or a global navigation satellite system (GNSS) communication module) or a wired communication module 1094 (e.g., a local area network (LAN) communication module or a power line communication (PLC) module). A corresponding one of these communication modules may communicate with the external electronic device via the first network 1098 (e.g., a short-range communication network, such as Bluetooth™, wireless-fidelity (Wi-Fi) direct, or infrared data association (IrDA)) or the second network 1099 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1092 may identify and authenticate the electronic device 1001 in a communication network, such as the first network 1098 or the second network 1099, using subscriber information (e.g., international mobile subscriber identity (IMSI)) stored in the subscriber identification module 1096.

The antenna module 1097 may transmit or receive a signal or power to or from the outside (e.g., the external electronic device) of the electronic device 1001. According to an embodiment, the antenna module 1097 may include an antenna including a radiating element composed of a conductive material or a conductive pattern formed in or on a substrate (e.g., PCB). According to an embodiment, the antenna module 1097 may include a plurality of antennas. In such a case, at least one antenna appropriate for a communication scheme used in the communication network, such as the first network 1098 or the second network 1099, may be selected, for example, by the communication module 1090 (e.g., the wireless communication module 1092) from the plurality of antennas. The signal or the power may then be transmitted or received between the communication module 1090 and the external electronic device via the selected at least one antenna. According to an embodiment, another component (e.g., a radio frequency integrated circuit (RFIC)) other than the radiating element may be additionally formed as part of the antenna module 1097.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1001 and the external electronic device 1004 via the server 1008 coupled with the second network 1099. Each of the electronic devices 1002 and 1004 may be a device of a same type as, or a different type, from the electronic device 1001. According to an embodiment, all or some of operations to be executed at the electronic device 1001 may be executed at one or more of the external electronic devices 1002, 1004, or 1008. For example, if the electronic device 1001 should perform a function or a service automatically, or in response to a request from a user or another device, the electronic device 1001, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1001. The electronic device 1001 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 1040) including one or more instructions that are stored in a storage medium (e.g., internal memory 1036 or external memory 1038) that is readable by a machine (e.g., the electronic device 1001). For example, a processor (e.g., the processor 1020) of the machine (e.g., the electronic device 1001) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

According to the embodiments disclosed in the disclosure, the noise occurring in the process of measuring the distance between the external object and the electronic device in the ToF sensor may be reduced. Further, according to the embodiments disclosed in the disclosure, the size of the hole in which the ToF sensor is disposed may be reduced.

In addition, various effects may be provided that are directly or indirectly understood through the disclosure.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a cover glass;
   a rear cover configured to face the cover glass;
   a display disposed between the cover glass and the rear cover and having a hole formed in a specified area;
   a shielding layer disposed between the display and the rear cover and having the hole formed in an area corresponding to the specified area;
   a sensor module disposed in the hole to measure a distance between the electronic device and an external object;
   a printed circuit board (PCB) disposed between the shielding layer and the rear cover; and
   at least one processor disposed on the printed circuit board and operatively connected to the sensor module,
   wherein the sensor module includes:
      a light emitting part configured to emit light based on a signal received from the processor,
      a receiving part to receive the emitted light after being reflected from the external object and returning back,
      a substrate on which the light emitting part and the receiving part are disposed,
      a cover attached on the substrate to surround the light emitting part and the receiving part, and
      a diaphragm structure disposed on the cover to be positioned between the light emitting part and the receiving part, disposed directly below the cover glass, and including:
         a first region to block first reflected light reflected from the shielding layer among the emitted light, and
         a second region to block second reflected light reflected from the cover glass among the emitted light.

2. The electronic device of claim 1, wherein the first region and the second region have a stepped structure when the diaphragm structure is viewed from the light emitting part and the receiving part.

3. The electronic device of claim 1,
   wherein the first region has a first length extending in a first direction, and
   wherein the second region has a second length extending in the first direction and shorter than the first length.

4. The electronic device of claim 1,
   wherein the first region is formed on the cover, and
   wherein the second region is formed on the first region.

5. The electronic device of claim 1, wherein the sensor module further includes a camera configured to photograph the external object.

6. The electronic device of claim 5, wherein the at least one processor is configured to obtain image data corresponding to the external object in response to a user input received through the display.

7. The electronic device of claim 1, wherein the sensor module further includes a flexible printed circuit board configured to connect the light emitting part and the receiving part to the processor.

8. The electronic device of claim 1, wherein the diaphragm structure is formed as a concave-convex diaphragm structure to block light reflected by the shielding layer.

9. The electronic device of claim 1, further comprising:
a rear glass disposed on a first region of the rear cover; and
a rear sensor module exposed through the rear glass.

10. The electronic device of claim 9, wherein the rear sensor module includes:
a rear light emitting part configured to emit light, and
a rear receiving part configured to:
receive light which is reflected from the external object, and
return back the light emitted from the rear light emitting part.

11. The electronic device of claim 10, further comprising:
a rear diaphragm structure disposed between the rear light emitting part and the rear receiving part;
a waterproof tape configured to attach the rear glass to the rear diaphragm structure; and
a poron formed on a surface of the rear glass facing the rear sensor module.

12. The electronic device of claim 11, wherein the waterproof tape reflects part of the light emitted from the rear light emitting part to be emitted toward outside of the rear glass.

13. The electronic device of claim 11, wherein the poron blocks light reflected from the rear glass among the light emitted from the rear light emitting part.

* * * * *